United States Patent
Frank et al.

(10) Patent No.: US 6,769,102 B2
(45) Date of Patent: Jul. 27, 2004

(54) VERIFYING PROXIMITY OF GROUND METAL TO SIGNAL TRACES IN AN INTEGRATED CIRCUIT

(75) Inventors: Mark D. Frank, Longmont, CO (US); Jerimy Nelson, Ft. Collins, CO (US); Peter Shaw Moldauer, Wellington, CO (US)

(73) Assignee: Hewlett-Packard Development Company, Houston, TX (US)

( * ) Notice: Subject to any disclaimer, the term of this patent is extended or adjusted under 35 U.S.C. 154(b) by 124 days.

(21) Appl. No.: 10/199,127

(22) Filed: Jul. 19, 2002

(65) Prior Publication Data

US 2004/0015795 A1 Jan. 22, 2004

(51) Int. Cl.⁷ .............................................. G06F 17/50

(52) U.S. Cl. .................................. 716/5; 716/4; 716/1

(58) Field of Search ................................... 716/5, 4, 1

(56) References Cited

U.S. PATENT DOCUMENTS

| | | | |
|---|---|---|---|
| 5,383,132 A | 1/1995 | Shinohara et al. | 364/491 |
| 5,481,695 A | 1/1996 | Purks | 395/500 |
| 5,510,998 A | 4/1996 | Woodruff et al. | 364/489 |
| 5,559,718 A | 9/1996 | Baisuck et al. | 364/491 |
| 5,590,049 A | 12/1996 | Arora | 364/489 |
| 5,663,891 A | 9/1997 | Bamji et al. | 364/490 |
| 5,729,466 A | 3/1998 | Bamji | 364/488 |
| 5,896,300 A | 4/1999 | Raghavan et al. | 364/491 |
| 5,953,518 A | 9/1999 | Sugasawara et al. | 395/500 |
| 6,182,258 B1 | 1/2001 | Hollander | 714/739 |
| 6,282,693 B1 | 8/2001 | Naylor et al. | 716/8 |
| 6,289,489 B1 * | 9/2001 | Bold et al. | 716/1 |
| 6,301,693 B1 | 10/2001 | Naylor et al. | 716/10 |
| 6,311,318 B1 | 10/2001 | Souef et al. | 716/18 |
| 6,324,675 B1 | 11/2001 | Dutta et al. | 716/13 |
| 6,336,206 B1 | 1/2002 | Lockyear | 716/7 |
| 6,363,520 B1 | 3/2002 | Boubezari et al. | |
| 6,381,730 B1 * | 4/2002 | Chang et al. | 716/5 |
| 6,499,129 B1 | 12/2002 | Srinivasan et al. | |
| 6,581,196 B2 | 6/2003 | Eisenberg et al. | |
| 2001/0010090 A1 | 7/2001 | Boyle et al. | 716/2 |
| 2001/0011903 A1 | 8/2001 | O'Neill et al. | |
| 2001/0016933 A1 | 8/2001 | Chang et al. | 716/1 |
| 2001/0052107 A1 | 12/2001 | Anderson et al. | 716/4 |
| 2002/0004931 A1 | 1/2002 | Stralen | 716/18 |

OTHER PUBLICATIONS

"Alternate Verilog FAQ," Version 9.13, http://www.angelfire.com/in/verilogfaq/index.html (Jun. 2001).

"Advanced Package Designer," Cadence Design Systems, Inc. (2000).

"Advanced Package Engineer," Cadence Design Systems, Inc. (2000).

"What's New in IC Packaging," Cadence Design Systems, Inc. (2000).

"Allegro Designer/Allegro Expert," Cadence Design Systems, Inc. (2001).

(List continued on next page.)

*Primary Examiner*—Vuthe Siek
*Assistant Examiner*—Brandon Bowers (57) ABSTRACT

Techniques are disclosed for verifying the proximity of signal return paths (e.g., ground metal or power) to signal traces in an integrated circuit package design. A package designer creates the package design using a package design tool. A proximity verifier verifies that there is a signal return path within a predetermined threshold distance of each specified signal trace in the package layers directly above and/or below the signal trace. The proximity verifier may notify the package designer of any signal traces which are not sufficiently close to signal return paths, such as by providing visual indications of such signal traces in a graphical representation of the package design. In response, the package designer may modify the package model to ensure that all signal traces are sufficiently close to signal return paths.

37 Claims, 8 Drawing Sheets

OTHER PUBLICATIONS

"Pacific Numerix Joint Solution With Cadence," Cadence Design Systems, Inc. (1998).

"BSDArchitect New Edition", Mentor Graphics Corporation (2000).

"FastScan V8.9_5 Enhancement Value", Mentor Graphics Corporation (2001).

"FastScan ATPG Tool Suite", Mentor Graphics Corporation (2001).

"Flex Test", Mentor Graphics Corporation (1999).

"TetraMAX ATPG Automatic Test Pattern Generation," Synopsys, Inc. (2001).

"TetraMAX ATPG High–Performance Automatic Test Pattern Generator Methodology Backgrounder," Synopsys, Inc. (1999).

* cited by examiner

FIG. 6

VERIFYING PROXIMITY OF GROUND METAL TO SIGNAL TRACES IN AN INTEGRATED CIRCUIT

CROSS REFERENCE TO RELATED APPLICATIONS

This application is related to the following commonly-owned and concurrently-filed patent applications, each of which is incorporated by reference herein:

an application entitled "Verifying Proximity of Ground Vias to Signal Vias in an Integrated Circuit," Attorney Docket No. 100100396-1; and an application entitled "Inter-Signal Proximity Verification in an Integrated Circuit," Attorney Docket No. 100100397-1.

BACKGROUND

1. Field of the Invention

The present invention relates to integrated circuit design and, more particularly, to techniques for providing sufficient ground return for signal traces in layers of an integrated circuit.

2. Related Art

Integrated circuits (ICs) are becoming increasingly large and complex, typically including millions of individual circuit elements such as transistors and logic gates. As a result of this increased size and complexity, IC designers are increasingly using electronic design automation (EDA) software tools to assist with IC design. Such tools help to manage the complexity of the design task in a variety of ways, such as by allowing ICs to be designed hierarchically, thereby enabling the design to be divided into modules and enabling the design task to be divided among multiple designers in a manner that limits the complexity faced by any one designer.

Various hardware description languages (HDLs) have been developed which allow circuit designs to be described at various levels of abstraction. A description of a circuit according to an HDL (referred to herein as an "HDL model" of the circuit) may, for example, describe a particular circuit design in terms of the layout of its transistors and interconnects on an IC, or in terms of the logic gates in a digital system. Descriptions of a circuit at different levels of abstraction may be used for different purposes at various stages in the design process. HDL models may be used for testing circuits and circuit designs, as well as for fabricating the circuits themselves. The two most widely-used HDLs are Verilog and VHDL (Very High Speed Integrated Circuits (VHSIC) Hardware Description Language), both of which have been adopted as standards by the Institute of Electrical and Electronics Engineers (IEEE). VHDL became IEEE Standard 1076 in 1987 and Verilog became IEEE Standard 1364 in 1995.

EDA tools are typically capable of converting a functional HDL description of a circuit design into a specific circuit implementation. The specific circuit implementation may be represented by a "netlist," which identifies both the elements of the circuit and the interconnections among them. In general, a netlist describes the circuit design in terms of nodes and edges. Each node represents a circuit element and each edge represents an interconnection between two circuit elements. Netlists may describe circuits at various levels of abstraction. A netlist may, for example, describe circuit elements in terms of specific structural components (such as resistors and transistors) or in terms of high-level "cells" that may be decomposed into specific structural components and/or other cells. A netlist may, for example, describe the connections between cells in terms of specific cell-to-cell pin connections.

EDA tools are typically capable of converting a netlist into a physical layout of the circuit. The layout process involves both "placement" (assigning specific coordinates in the circuit layout to each cell) and "routing" (wiring or connecting cells together). The layout produced thereby defines the specific dimensions and coordinates of the gates, interconnects, contacts, and other elements of the circuit. The layout may have multiple layers, corresponding to the layers of the circuit. The layout may be used to form a mask, which in turn may be provided to a foundry to fabricate the integrated circuit itself.

One stage in the process of IC design is package design, which refers to the design of substrates (packages) for interconnecting layers of the IC. An IC typically includes multiple packages interconnected in layers. Each package, in turn, may include multiple layers (also referred to as "planes"). Packages within a single IC may be composed of varying materials having varying electrical properties. Individual signal nets (also referred to herein simply as "nets") in the IC may be distributed across multiple packages. A package design must ensure that signals in the IC have sufficient power and maintain sufficient signal integrity when passing from one layer of the IC to another. As used herein, the term "signal net" (or simply "net") refers to a collection of conductors that are connected to form a complete circuit connecting at least one output to at least one input.

As with IC design more generally, various tools exist for automating aspects of IC package design. Such tools typically provide a graphical user interface through which package designers may visually design the IC package in three dimensions. For example, referring to FIG. 1, a prior art package. design system 100 is shown in which a human package designer 116 creates and modifies a model 102 of an integrated circuit package using a package design tool 104. The package designer 116 may, for example, use a keyboard 114 or other input device to provide input 108 to the package design tool 104, in response to which the package design tool 104 may modify the package model 102 and display a graphical representation 106 of the package model 102 (or of particular layers therein) on a display monitor 112. The graphical representation 106 typically displays signal traces as lines on a two-dimensional grid.

Figure 1:
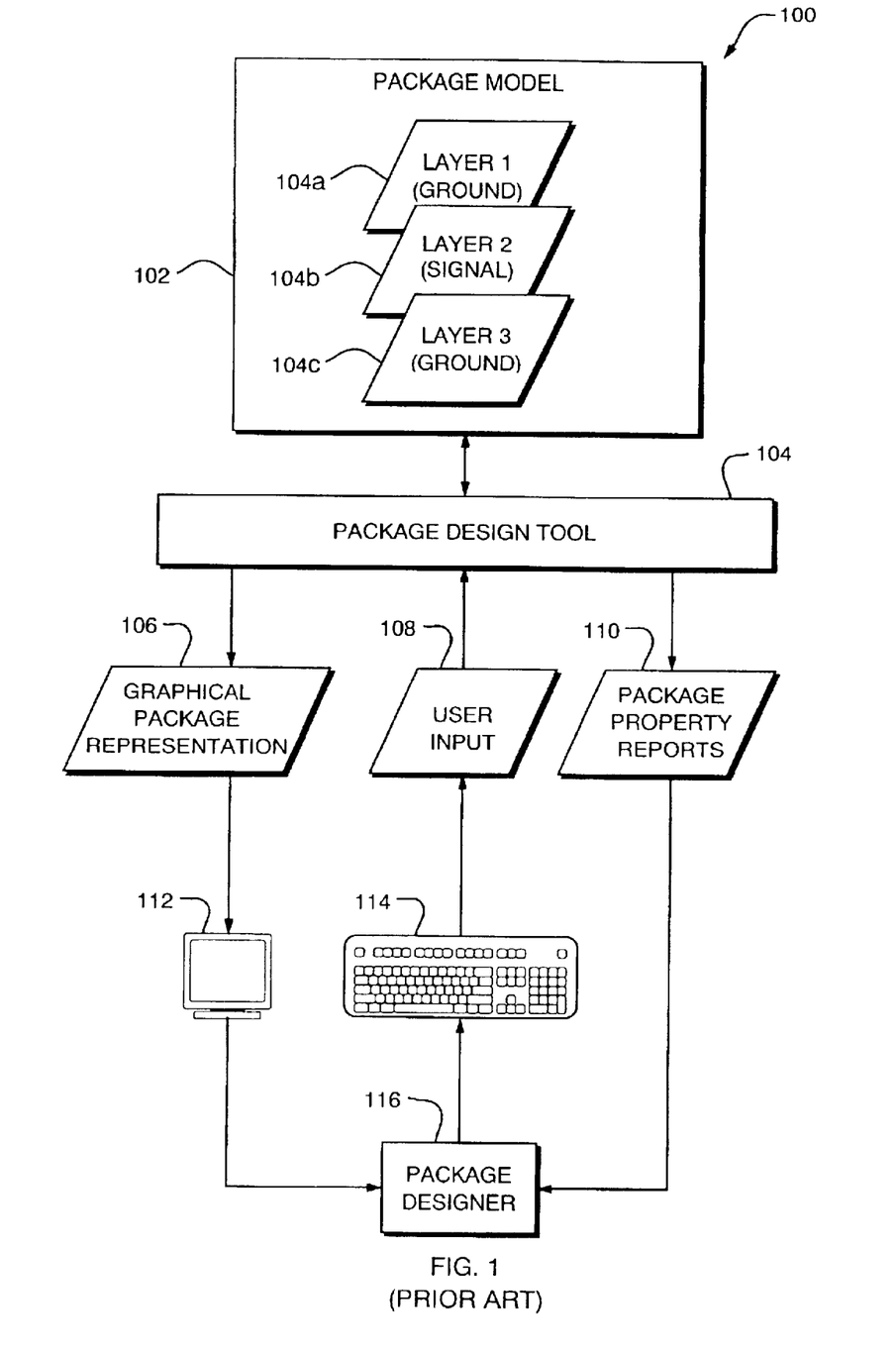
FIG. 1 is a functional block diagram of a prior art system for creating and editing a model of an integrated circuit package.

The package model 102 may include, for example, information specifying the name, location, and size of each signal trace, ground metal, via, and other elements of the package model 102. The package model 102 is typically stored in a database file in a computer system.

One example of the package design tool 104 is Advanced Package Designer (APD), available from Cadence Design Systems, Inc. of San Jose, Calif. APD is a software program which allows the package designer 116 to model the physical, electrical, and thermal characteristics of the package substrate. An APD package design database (e.g., the package model 102) may be provided to a foundry to be used directly as manufacturing input for fabrication of the designed package.

It is common for package designs to include distinct signal layers and ground layers. For example, package model 102 includes layers 104a–c, including ground layer 104a, signal layer 104b, and ground layer 104c. Although package models typically contain additional layers, only the three layers 104a–c are shown in FIG. 1 for ease of illustration. A signal layer (such as layer 104b) typically includes only signal traces (also referred to as signal lines), while a ground layer (such as layers 104a and 104c) typically includes only ground metal, typically arranged either in a grid or in a solid plane. Signal layers and ground layers are often arranged so that each signal layer is located between two ground layers. It is important that there be ground metal directly above or below each signal trace in a signal layer to ensure an adequate ground return path for each signal trace.

Lack of ground metal above or below a signal trace may result from a variety of causes. For example, if the ground planes above and below a signal plane include ground lines arranged in a grid, a particular signal trace in the signal plane may be routed between the ground lines above and below it, resulting in lack of sufficient ground return. Even if the ground planes include a solid plane of ground metal, there may be gaps in the ground metal plane. For example, a via (an inter-layer connector) that penetrates the ground plane causes a gap in the ground metal at and in the vicinity of the via. A signal trace that is routed directly above or below this gap may lack sufficient ground return.

Current package design tools do not automatically verify that there is ground metal above or below all signal traces in a package design. As a result, the human package designer 116 must typically manually verify the proximity of ground metal to signal traces. This is a tedious, time-consuming, and error-prone process.

To verify that there is ground metal above or below each signal trace, the package designer 116 may visually inspect the graphical representation 106 to determine whether ground metal is sufficiently close to each signal trace. Signal and ground layers may, for example, be superimposed on each other in the graphical package representation. Verifying the proximity of signal traces to ground metal by visually inspecting the graphical package representation 106 may be difficult due to the large number of signal traces and ground metal wires, as well as to the superimposition of layers on each other, which may obscure features of one layer under the features of the other layer.

Additionally or alternatively, the package design tool 104 may generate textual package property reports 110 which list various properties of the package model 102, such as the locations and lengths of signal traces and ground metal in the package model 102. The package designer 116 may attempt to verify the proximity of signal traces to ground metal by inspecting the reports 110. Both of these methods are tedious, time-consuming, and difficult to perform accurately.

What is needed, therefore, are improved techniques for verifying that ground metal is sufficiently proximate to signal traces in an integrated circuit design.

SUMMARY

Techniques are disclosed for verifying the proximity of signal return paths (e.g., ground metal or power) to signal traces in an integrated circuit package design. A package designer creates the package design using a package design tool. A proximity verifier verifies that there is a signal return path within a predetermined threshold distance of each specified signal trace in the package layers directly above and/or below the signal trace. The proximity verifier may notify the package designer of any signal traces which are not sufficiently close to signal return paths, such as by providing visual indications of such signal traces in a graphical representation of the package design displayed on a display monitor. In response, the package designer may modify the package model to ensure that all signal traces are sufficiently close to signal return paths. The proximity verifier may be implemented as a design rule which may be executed automatically and in real-time by the package design tool.

Other features and advantages of various aspects and embodiments of the present invention will become apparent from the following description and from the claims.

DETAILED DESCRIPTION

Figure 2:
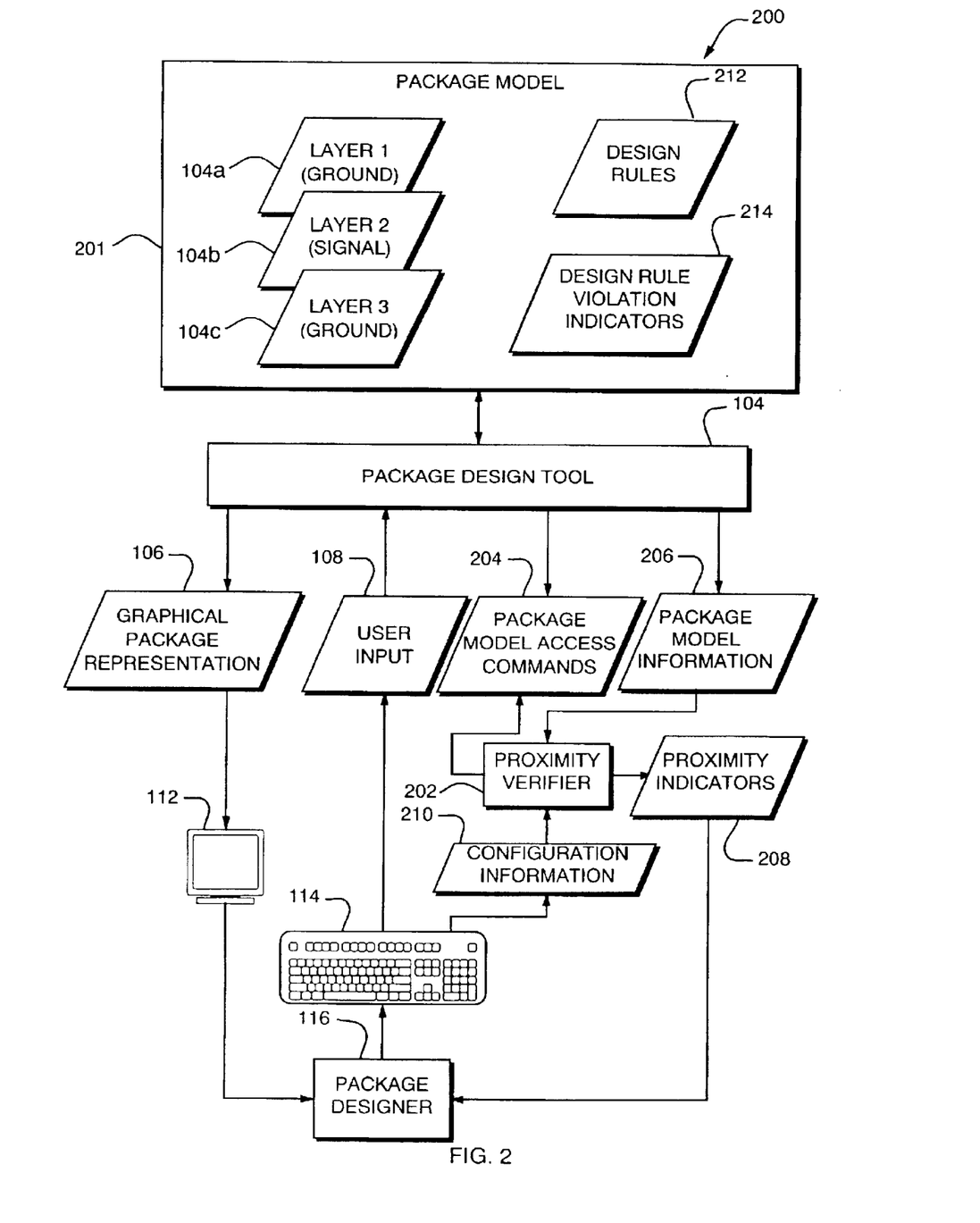
FIG. 2 is a functional block diagram of a system for verifying the proximity of ground metal to signal traces in an integrated circuit package design according to one embodiment of the present invention.

Referring to FIG. 2, a functional block diagram is shown of a system 200 for verifying the proximity of ground metal to signal traces in a model 201 of an integrated circuit package according to one embodiment of the present invention. The system 200 includes package design tool 104 (such as Advanced Package Designer), which may be a conventional package design tool as described above with respect to FIG. 1. The package designer 116 uses the package design tool 104 to create and modify package model 201 as further described above with respect to FIG. 1. The system 200 also includes a proximity verifier 202 for verifying the proximity of ground metal to signal traces in the package model 201. The package designer 116 instructs the proximity verifier 202 to perform verification on the package model 201. The package designer 116 may also transmit configuration information 210, containing parameters of the proximity verification process, to the proximity verifier 202.

The proximity verifier 202 transmits package model access commands 204 to the package design tool 104, in response to which the package design tool 104 transmits package model information 206 to the proximity verifier 202. The package model information 206 contains information descriptive of the package model 201, such as the location and size of signal traces and ground metal in the layers 104a–c of the package model 201. The proximity verifier 202 verifies the proximity of ground metal to signal traces in the package model 201 based on the package model information 206. The proximity verifier 202 generates proximity indicators 208, which indicate the results of the verification process. The proximity indicators 208 may, for example, indicate which signal traces, if any, in the package model 201 are not sufficiently close to ground metal.

The proximity verifier 202 may transmit the proximity indicators 208 to the package designer 116. The package designer 116 may inspect the proximity indicators 208, and may modify the package model 201 in response to the information contained in the proximity indicators 208. The package designer 116 may, for example, re-route any indicated signal traces in the package model 201 so that they are sufficiently close to ground metal.

Figure 3A:
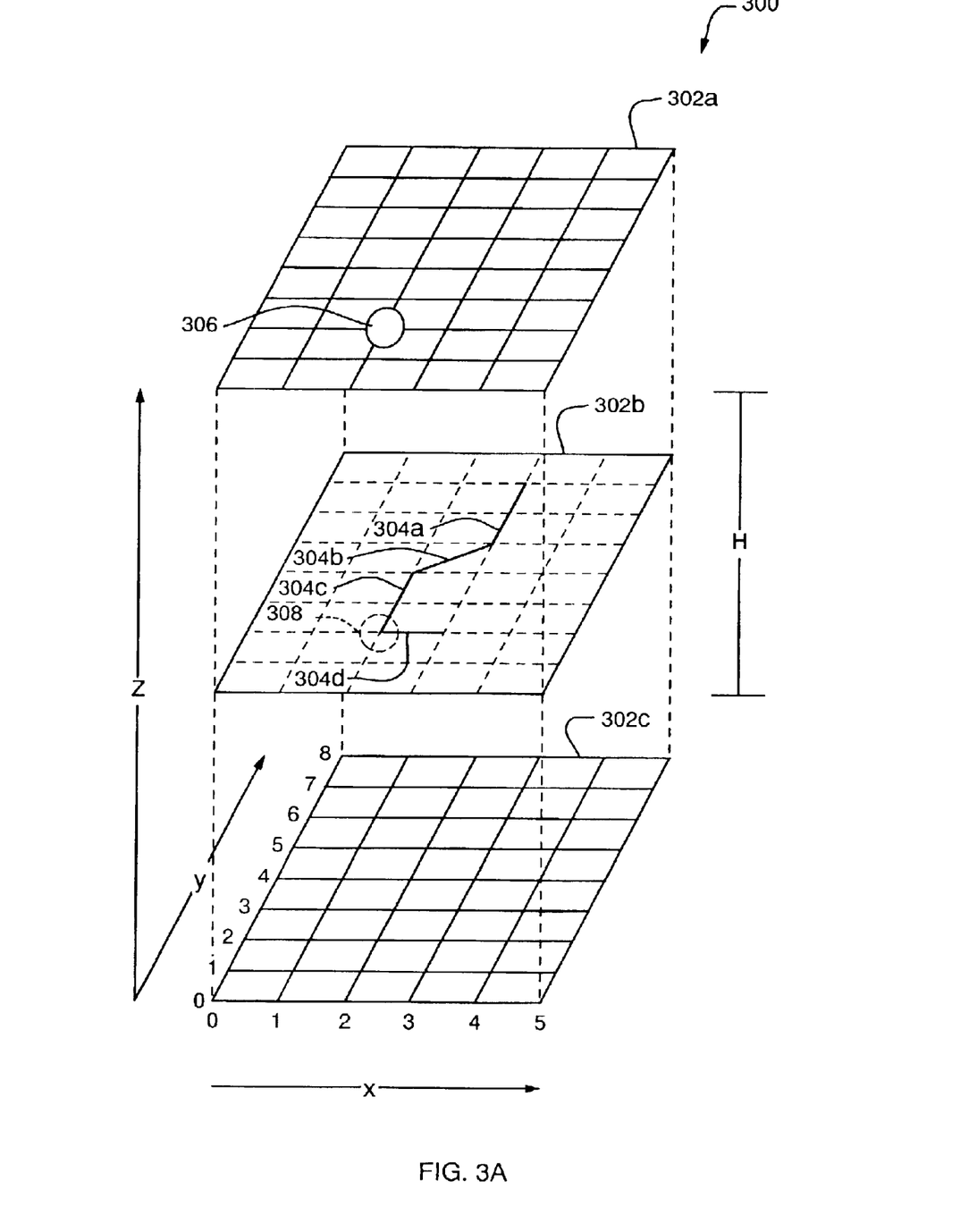
FIG. 3A is a perspective view of an integrated circuit package having three layers, including a signal layer between two ground layers, according to one embodiment of the present invention.

Operation of the system 200 according to various embodiments of the present invention will now be described in more detail. First, an example will be provided which illustrates the operation of various embodiments of the present invention more clearly. Referring to FIG. 3A, an example package 300 having three layers 302a–c is illustrated. The layers 302a–c may, for example, be the layers that are modeled by the layers 104a–c of the package model 201 (FIG. 2). Although package 300 has three layers 302a–c, in practice packages may have any number of layers. The package 300 may be one of multiple packages in an IC (not shown).

It should be appreciated that the layers 302a–c are not drawn to scale and that in general only relevant features of the layers 302a–c are shown for ease of illustration and explanation. The three dimensions of the package 300 are illustrated using x, y, and z axes. The values provided on the x and y axes in FIG. 3A do not correspond to particular units of measurement (such as millimeters or mils), but rather are generic units provided merely for ease of illustration and explanation. The x and y axes define what will be referred to herein as the "horizontal" dimensions of the package 300, while the z axis defines what will be referred to herein as the "vertical" dimension of the package 300.

The distance H between each layer of the package 300 will be referred to herein as a "vertical" distance. Signal nets traverse vertical path lengths through vias, which are vertical conductors or conductive paths forming the interconnection between one layer of an IC and another. The distance H is typically on the order of 100 $\mu$m. The distances traversed by signal nets within a single layer will be referred to herein as "horizontal" distances.

Layers 302a and 302c are ground layers. The surface of each of the layers 302a and 302c includes a grid of ground lines, as illustrated by solid lines in FIG. 3A. Ground layers 302a and 302c may alternatively be implemented as solid planes of ground metal, as will be described in more detail below.

A portion of a signal net is also shown in FIG. 3A. The signal net is referred to herein by reference numeral 304 and includes four segments 304a–d. Although only one signal net 304 is shown, a typical package may include thousands of signal nets. The first segment 304a of signal net 304 has (x,y) endpoints of (3,7) and (3,5). As may be seen from FIG. 3A, segment 304a lies along the same grid line in the x-y plane as the ground lines in ground layers 302a and 302c, directly above and below signal layer 302b. The locations of ground lines in ground layers 302a and 302c are illustrated by dashed lines in signal layer 302b for ease of reference.

Segment 304a has sufficient ground return because there are ground lines directly above and below its entire length.

The second segment 304b of signal net 304 has (x,y) endpoints of (3,5) and (2,4). As may be seen from FIG. 3A, segment 304b lies along a diagonal of one grid square in the ground layers 302a and 302c above and below signal layer 302b. Because there is no ground line directly above or below segment 304b (except at its endpoints), segment 304b may not have sufficient ground return. Techniques for determining whether segment 304b has sufficient ground return will be described in more detail below with respect to FIGS. 4A–4B.

The third segment 304c of signal net 304 has (x,y) endpoints of (2,4) and (2,2). As may be seen from FIG. 3A, segment 304a lies along the same grid line in the x-y plane as the ground lines in ground layers 302a and 302c, directly above and below signal layer 302b. Similarly, the fourth segment 304d of signal net 304 has (x,y) endpoints of (2,2) and (3,2), and lies along the same grid line in the x-y plane as the ground lines in ground layers 302a and 302c.

There is, however, a gap 306 in ground layer 302a, centered at (x,y) coordinates (2,2). The gap 306 may, for example, result from a via (not shown) that penetrates ground layer 302a. Although only the single gap 306 is illustrated in FIG. 3A, ground layers 302a and 302c may have various numbers of gaps having various shapes and sizes.

The location and extent of gap 306 is illustrated by a gap shadow 308 in layer 302b. As may be seen from the location and extent of the gap shadow 308, portions of signal trace segments 304c and 304d do not have a corresponding ground line in the layer 302a directly above them. As a result, segments 304c and 304d may not be provided with sufficient ground return.

Figure 4A:
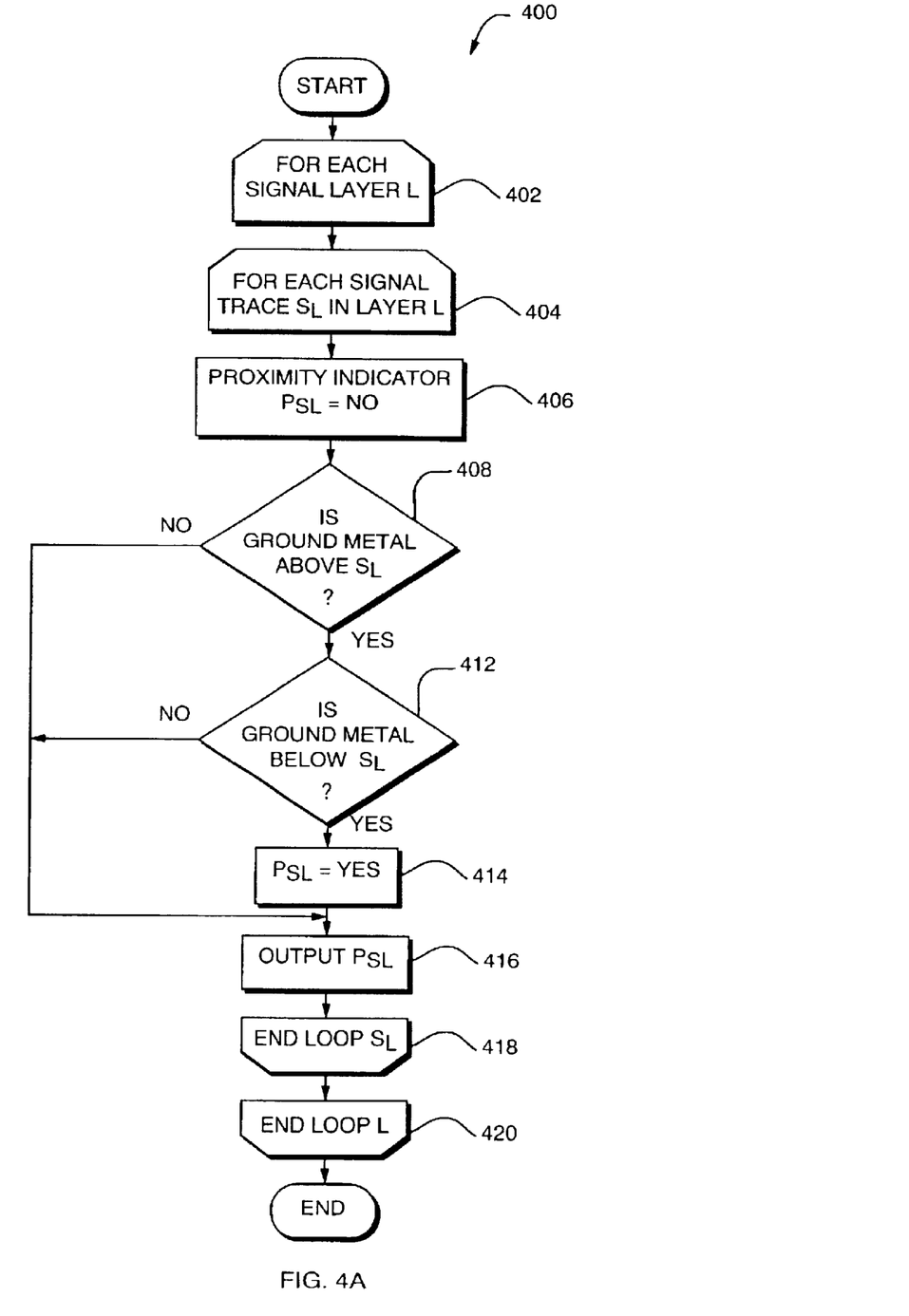
FIG. 4A is a flowchart of a method for verifying the proximity of ground metal to signal traces in an integrated circuit package according to one embodiment of the present invention.

Referring to FIG. 4A, a flowchart is shown of a proximity verification method 400 that is used by the proximity verifier 202 to verify the proximity of ground metal to signal traces in the package model 201 according to one embodiment of the present invention.

Prior to initiation of the method 400, the package designer 116 may provide configuration information 210 to the proximity verifier 202. The configuration information 210 may, for example, take the form of a command line with parameters, a configuration file stored on a hard disk drive, or commands issued to the proximity verifier 202 using a graphical user interface. Provision of the configuration information 210 to the proximity verifier 202 by the package designer 116 may therefore serve both to initiate the proximity verification method 400 and to provide parameter values to the proximity verifier 202 for use in the proximity verification method 400.

Figure 5:
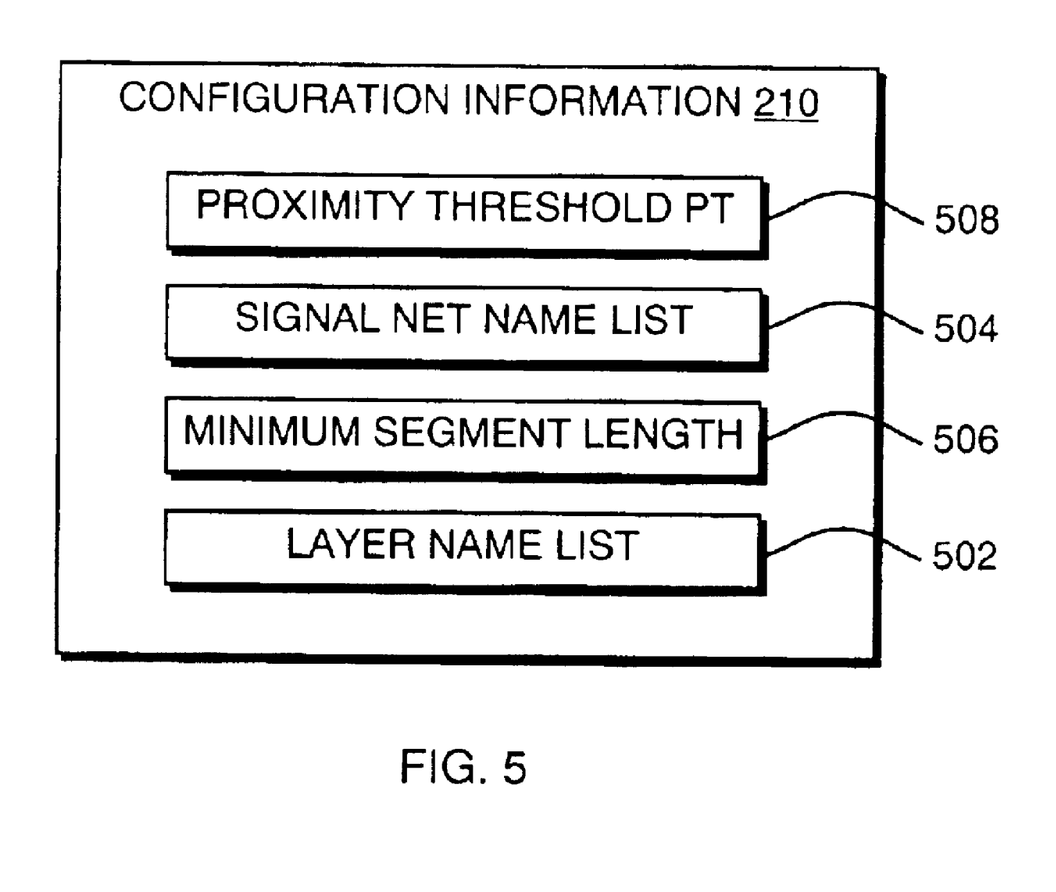
FIG. 5 is a block diagram of the logical structure of configuration information that is used to verify the proximity of ground metal to signal traces in an integrated circuit package according to one embodiment of the present invention.

Referring to FIG. 5, the logical structure of the configuration information 210 is illustrated according to one embodiment of the present invention. The configuration information 210 includes a proximity threshold 508, which specifies the maximum allowable distance between a signal trace and ground metal in the ground layers above and/or below it. The proximity threshold 508 may, for example, specify a horizontal distance, i.e., a distance between signal trace (x,y) coordinates and ground metal (x,y) coordinates. The proximity threshold 508 may be any value, and may be specified in any units, such as millimeters, mils, or microns. The configuration information 210 also includes a signal net name list 504, which is a list of the names of the signal nets to be processed by the proximity verification method 400. A signal net may span multiple layers in a package; a signal trace may therefore be a subset of a signal net.

The configuration information 210 also includes a minimum segment length 506, which specifies the minimum length of signal traces to be processed by the proximity verification method 400. The configuration information 210 also includes a layer name list 502, which is a list of the names of package layers to be processed by the proximity verification method 400. The signal net name list 504 and the layer name list 502 may specify the names of signal nets and layers, respectively, using the same names used within the package model 201 itself.

Referring again to FIG. 4A, the proximity verification method 400 enters a loop over each signal layer L specified by the layer name list 502 (step 402). The method 400 enters a loop over each signal trace $S_L$ specified by the signal net name list 504 (step 404). In other words, if S is a signal net specified by the signal net name list 504, $S_L$ refers to that portion of signal net S that lies within layer L.

The method 400 initializes a proximity indicator $P_{SL}$ for signal trace $S_L$ to a value of NO (step 406). A proximity indicator value of NO indicates that the corresponding signal trace is not sufficiently proximate to ground metal, and a proximity indicator value of YES indicates that the corresponding signal trace is sufficiently proximate to ground metal.

The method 400 determines whether there is ground metal above and sufficiently close to signal trace $S_L$ (step 408). If such ground metal exists, the method 400 determines whether there is ground metal below and sufficiently close to signal trace $S_L$ (step 412). If such ground metal exists, $P_{SL}$ is assigned a value of YES (step 414). Thus, $P_{SL}$ is only assigned a value of YES if ground metal is both above and below and sufficiently close to signal trace $S_L$.

Upon completion of step 408, 412, or 414, the method 400 outputs the value of $P_{SL}$, e.g., by adding the value of $P_{SL}$ to the proximity indicators 208 (step 416). It should be appreciated that upon performance of step 416 the value of $P_{SL}$ indicates whether there is ground metal both above and below and sufficiently close to signal trace $S_L$. In an alternative embodiment, however, the method 400 may assign a value of YES to $P_{SL}$ if there is ground metal either above or below and sufficiently close to signal trace $S_L$ (i.e., if the result of either decision step 408 or 412 is YES). The loops over $S_L$ and L respectively terminate in steps 418 and 420, thereby repeating steps 406–416 for each of the signal nets specified by the signal net name list 504 in each of the layers specified by the layer name list 502.

Upon completion of the method 400, the proximity indicators 208 indicate the proximity status of all of the signal traces specified by the signal net name list 504 in each of the layers specified by the layer name list 502. Alternatively, the proximity indicators 208 may indicate the proximity status of only those signal traces that are not sufficiently close to ground metal (i.e., for which the value of $P_{SL}$ is NO upon the conclusion of method 400), in which case the proximity indicators 208 may be considered to be error indicators. The proximity indicators 208 may, for example, be stored in a text file or be represented as design rule violation indicators 214 in the package model 201, as described in more detail below. The package designer 116 may examine the proximity indicators 208 to determine whether any signal traces should be re-routed to position them sufficiently closely to ground metal.

Figure 4B:
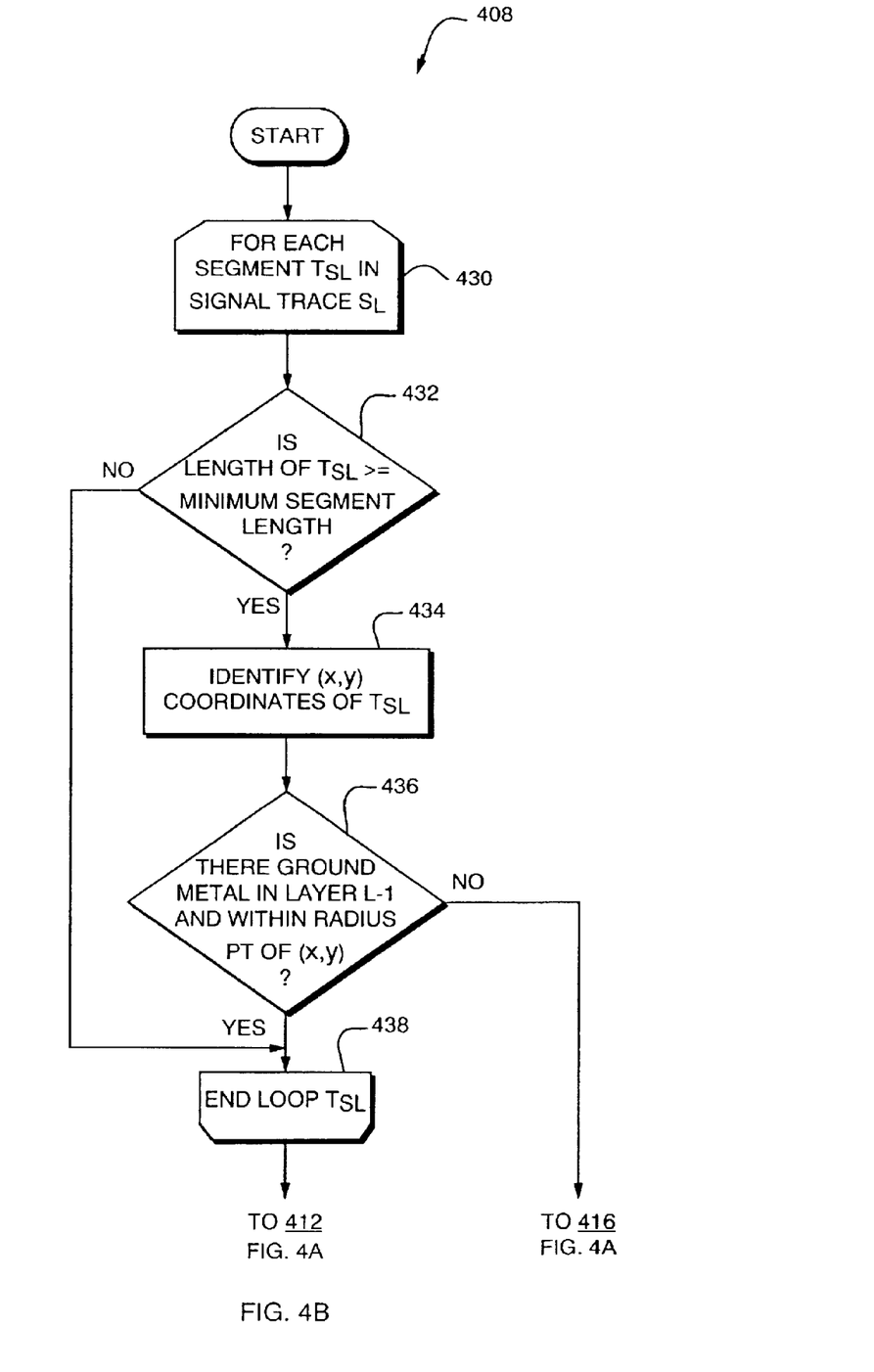
FIG. 4B is a flowchart of a method for determining whether there is ground metal above and sufficiently close to a signal trace in an integrated circuit package layer according to one embodiment of the present invention.

Having described generally the operation of the proximity verifier 202, various embodiments of the method 400 illustrated in FIG. 4A will now be described in more detail. Referring to FIG. 4B, a flowchart of a method is illustrated for determining whether there is ground metal above and sufficiently close to signal trace $S_L$ (FIG. 4A, step 408) according to one embodiment of the present invention. It should be appreciated that a similar method may be performed to determine whether there is ground metal below and sufficiently close to signal trace $S_L$ (FIG. 4A, step 412).

The method illustrated in FIG. 4B begins by entering a loop over each segment $T_{SL}$ in signal trace $S_L$ (step 430). For example, as described above with respect to FIG. 3A, signal trace 304 includes four segments 304a–d. The method determines whether the length of segment $T_{SL}$ is greater than or equal to the minimum segment length 506 specified in the configuration information (step 432). If the length of segment $T_{SL}$ is less than the minimum segment length 506, the method illustrated in FIG. 4B does not process segment $T_{SL}$.

If the length of segment $T_{SL}$ is greater than or equal to the minimum segment length 506, the proximity verifier 202 identifies (x,y) coordinates of $T_{SL}$ (step 434). As described in more detail below, these (x,y) coordinates may be one or more pairs of (x,y) coordinates.

The proximity verifier 202 determines whether there is ground metal in layer L-1 (i.e., the layer above layer L) within a circle centered at coordinates (x,y) and having a radius equal to the proximity threshold PT 508 (step 436). If there is no ground metal within such a circle, the loop over $T_{SL}$ is aborted and control is passed to step 416 (FIG. 4A), reflecting the fact that ground metal is not above and sufficiently close to signal trace $S_L$.

Figure 3B:
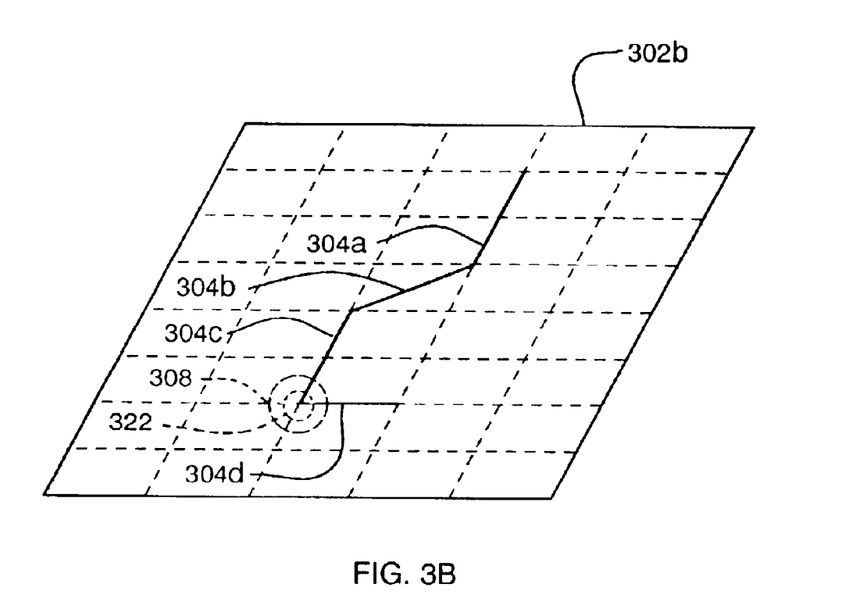
FIG. 3B is a magnified perspective view of the signal layer of the integrated circuit package illustrated in FIG. 3A.

For example, referring to FIG. 3B, signal layer 302b is magnified to more clearly illustrate the operation of step 436. As shown in FIG. 3B, circle 322 has a radius 320 equal in length to the proximity threshold PT 508. Circle 322 is centered at (x,y) coordinates (2,2), which may, for example, be identified as the (x,y) coordinates of segment 304c in step 434. As shown in FIG. 3B, circle 322 falls entirely within gap 308. As a result, step 436 of FIG. 4B would conclude that there is no ground metal in layer 302a within radius PT of the coordinates of segment 304c. Note that increasing the radius PT might change the outcome of step 436.

According to the method illustrated in FIG. 4B, the proximity verifier 202 determines whether ground metal in layer L-1 is "sufficiently close" to segment $T_{SL}$ by measuring a purely horizontal distance (i.e., a distance solely within the x-y plane) between segment $T_{SL}$ and ground metal in layer L-1. This is not, however, a limitation of the present invention. Rather, the proximity verifier 202 may determine whether a signal trace is sufficiently close to ground metal by measuring a distance having both horizontal and vertical components.

Steps 432–436 are repeated for each segment $T_{SL}$ of signal trace $S_L$ (step 438), unless the loop is aborted after step 436. If the loop performed in steps 430–438 terminates successfully, control is passed to step 412 (FIG. 4A), reflecting the fact that there is ground metal above and sufficient close to each segment $T_{SL}$ in signal trace $S_L$.

In summary, the method illustrated in FIG. 4B determines that there is ground metal above and sufficiently close to signal trace $S_L$ if there is ground metal above and sufficiently close to each segment $T_{SL}$ of signal trace $S_L$ If ground metal is not above and sufficiently close to one or more of the segments $T_{SL}$ of signal trace $S_L$, the method illustrated in FIG. 4B determines that ground metal is not above and sufficiently close to signal trace $S_L$.

The method illustrated in FIG. 4B could be implemented in other ways, such as by requiring that a particular number, percentage, or aggregate length of segments of signal trace $S_L$ be sufficiently close to ground metal in the layer above layer L. In another embodiment, the proximity verifier 202 generates separate proximity indicators for each segment $T_{SL}$, rather than generating a single proximity indicator for the entire signal trace $S_L$.

The methods described above with respect to FIGS. 4A–4B make use of various data from the package model 201, such as the names and coordinates of signal traces. Various techniques that may be used by the proximity verifier 202 to access and process such data will now be described in more detail.

As described above with respect to FIG. 2, the proximity verifier 202 may access information in the package model 201 by transmitting package model access commands 204 to the package design tool 104. The package model access commands 204 may take any of a variety of forms. For example, the package design tool 104 may provide an application program interface (API) through which external software programs may access information contained in the package model 201 using commands defined according to the API. The proximity verifier 202 may be implemented as such a software program, and the package model access commands 204 may be implemented as commands defined according to the package design tool's API. The API may include both commands for reading information from the package model 201 and commands for writing information to the package model 201. In such an implementation, the proximity verifier 202 transmits package model access commands 204 to the package design tool 104, in response to which the package design tool 104 either modifies information in the package model 201 or transmits the requested information about the package model to the proximity verifier 202 in the form of package model information 206.

The package model information 206 may, for example, be a report, such as one of the conventional package property reports 110 described above with respect to FIG. 1. Such a report may be a text file including information such as the names, locations, and sizes (e.g., lengths or diameters) of signal traces, ground metal, vias, and other elements of the package model. The proximity verifier 202 may process the information in such a report to perform the functions described herein using techniques that are well-known to those of ordinary skill in the art.

The proximity verifier 202 may be implemented as a software program that executes within the design environment provided by the package design tool 104. For example, the APD package design tool described above provides a scripting language named "Skill." Scripts written in the Skill language may be executed within the APD design environment, e.g., while the package designer 116 is using the package design tool 104 to design the package model 201. The proximity verifier 202 may be implemented as a Skill script, in which case the package model access commands 204 may be Skill commands issued by the proximity verifier 202 to the package design tool 104. Alternatively, the proximity verifier 202 may, for example, be implemented as a Perl script for use with other package design tools.

Referring again to FIG. 2, the package model 201 may include design rules 212 which specify constraints that elements within the package model 201 must satisfy to ensure successful fabrication and operation of the package being modeled. Such constraints may include, for example, electrical, geometrical, or timing constraints. A design rule may, for example, specify a minimum distance between signal traces in a layer, or specify a maximum signal trace density in a layer. Conventional package design tools, such as APD, typically provide default design rules and means for specifying additional design rules to be applied to a package model. Conventional package design tools also typically include automated Design Rule Checkers (DRCs), which automatically determine whether the active design rules are satisfied, and which use design rule violation indicators 214 to alert the package designer 116 to any design rules which are violated by the package model 201. The design rule violation indicators 214 may, for example, be visual indicators (such as a red flag) displayed at the location of the violation within the graphical package representation 106 that is displayed to the package designer 116.

Rather than providing the package designer 116 with external proximity indicators 208 to indicate whether ground metal is sufficiently close to signal traces in the package model 201, the proximity verifier 202 may use package model access commands 204 to insert design rule violation indicators 214 into the package model 201 when the proximity verifier 202 determines that ground metal is not sufficiently close to a signal trace. For example, referring again to FIG. 4A, step 416 (outputting the proximity indicator $P_{SL}$) may be implemented by adding a design rule violation indicator to the package model 201 if the value of $P_{SL}$ is NO. The design rule violation indicator thus provided may indicate the layer and signal trace in which the design rule violation was identified. Techniques for adding design rule violation indicators to package models maintained by conventional package design tools are well-known to those of ordinary skill in the art.

In one embodiment, the requirement that there be ground metal either above or below and sufficiently close to signal traces in the package model 201 is implemented using a design rule (referred to herein as the "proximity rule") within the design rules 212. In such an embodiment, it may not be necessary for the proximity verifier 202 to be implemented as a distinct external component, since the package design tool 104 may automatically apply the proximity rule. Furthermore, in such an embodiment, the proximity rule may be designed to verify that there is ground metal above or below and sufficiently close to the signal trace currently being edited by the package designer 116, rather than to verify the proximity of ground metal to a plurality of signal traces, as illustrated and described above with respect to FIGS. 4A and 4B.

Some package design tools, such as APD, provide "real-time" design rule checking, according to which the design rule violation indicators 214 are provided (e.g., displayed) to the package designer 116 as the package designer 116 designs the package model 201. For example, the package designer 116 may place a new signal trace within a layer of the package model 201 by using a mouse to drag a graphical representation of the signal trace to an appropriate location within the layer. The package design tool 104 may visually indicate to the package designer 116 in real-time whether the new signal trace is too close to existing signal traces, such as by displaying a red flag on the monitor 112 when the designer 116 drags the new signal trace too close to an existing signal trace.

The proximity rule may, for example, be implemented as a real-time design rule. In such an implementation, the package design tool 104 may verify in real-time that the proximity rule is satisfied for the signal trace being edited by the package designer 116, and provide appropriate design rule violation indicators 214 when the proximity rule is violated.

As described above with respect to FIG. 4B, the proximity verifier 202 may identify (x,y) coordinates of segment $T_{SL}$ of signal trace $S_L$ (step 434). Examples of various ways in which the proximity verifier 202 may identify such coordinates will now be described in more detail.

Figure 6:
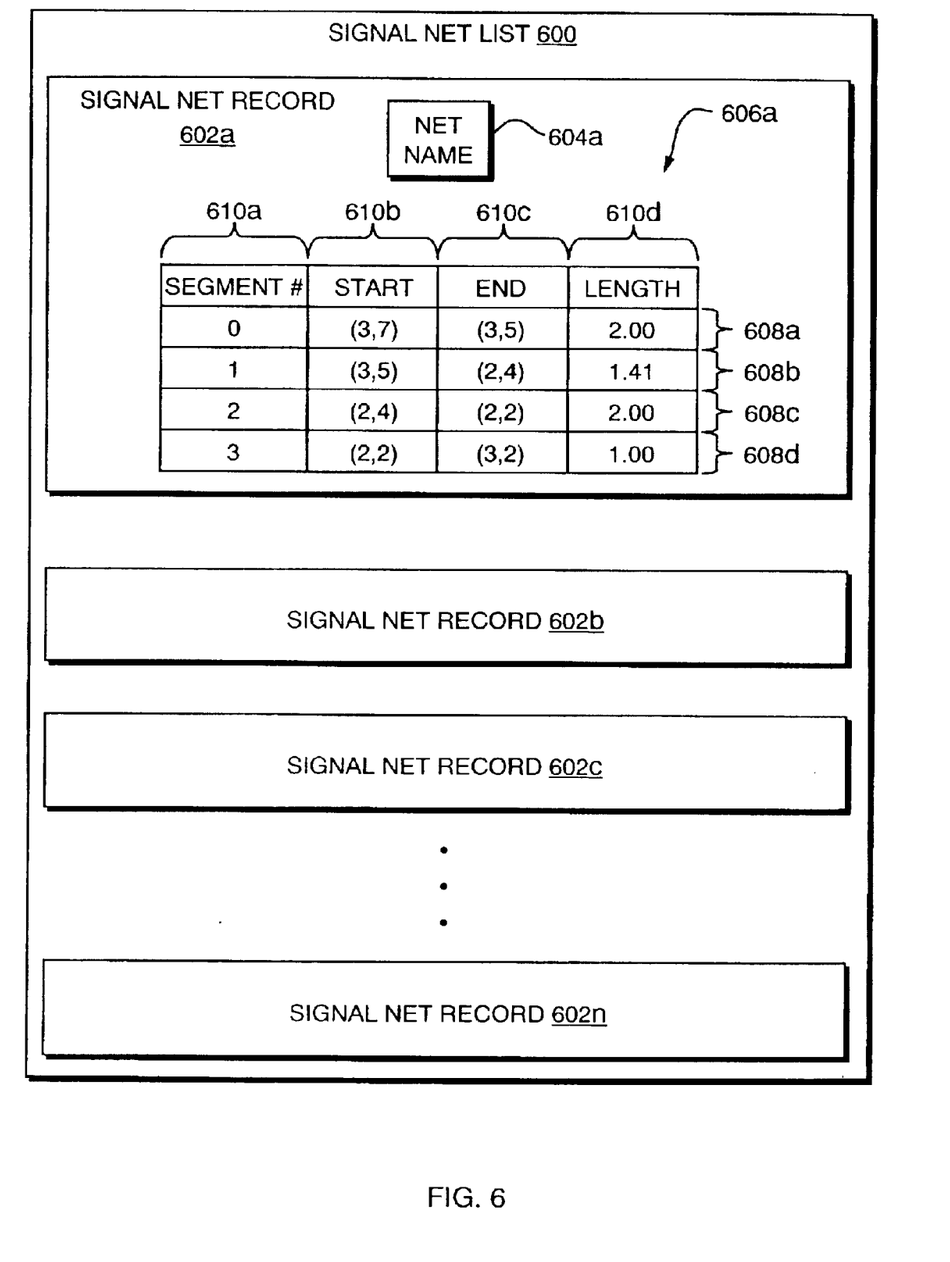
FIG. 6 is a block diagram of the logical structure of a signal net list that is used to verify the proximity of ground metal to signal traces in an integrated circuit package according to one embodiment of the present invention.

Referring to FIG. 6, an example of a signal net list 600 is illustrated which contains information related to signal nets in the package model 201, such as the coordinates and lengths of such signal nets. The package design tool 104 may, for example, generate and provide the signal net list 600 within the package model information 206 for use by the proximity verifier 202. The signal net list 600 includes a plurality of signal net records 602a–n, each of which contains information about a particular signal net in the package model 201. Although only signal net record 602a is illustrated in detail in FIG. 6, it should be appreciated that the remaining signal net records 602a–n may have the same logical structure as signal net record 602a.

Assume for purposes of example that signal net record 602a contains information about the signal trace 304 illustrated in FIGS. 3A–3B. Although the signal net record 602a may contain information about additional signal traces in the same signal net, only information pertaining to signal trace 304 is illustrated in FIG. 6 for ease of illustration.

Signal net record 602a includes a net name 604a, which indicates the name of the signal net of which signal trace 304 is a part. The proximity verifier 202 may, for example, determine whether the signal trace 304 is specified by the signal net name list 504 (FIG. 4A, step 404) by comparing the net name 604a to the names in the signal net name list 504.

The signal net record 602a also includes a segment list 606a, which includes a plurality of list elements 608a–d, each of which corresponds to a particular segment in the signal trace 304 (FIG. 3A). For example, element 608a corresponds to segment 304a, element 608b corresponds to segment 304b, etc. Each of the list elements 608a–d includes a segment number field 610a, a starting coordinates field 610b, an ending coordinates field 610c, and a length field 610d.

The segment number field 610a specifies a unique segment number for the corresponding segment. Although the segment numbers illustrated in FIG. 6 are sequential numbers, segment numbers may take the form of any kind of identifier and need not be sequential. Starting coordinates field 610b specifies the (x,y) (i.e., horizontal) coordinates at which the corresponding segment begins, while ending coordinates field 610c specifies the (x,y) coordinates at which the corresponding segment ends. For example, as shown in FIG. 6, the starting coordinates 610b of segment 304a (corresponding to list element 608a) are (3,7), and the ending coordinates 610c of segment 304a are (3,5).

Length field 610d specifies the length of the corresponding segment. The length field 610d of element 608a, for example, indicates that the length of segment 304a is 2.00 units. Note that the length of a segment may alternatively be computed from the coordinates in the corresponding start 610b and end 610c fields.

Referring again to FIG. 4B, the proximity verifier 202 may identify (x,y) coordinates of segment $T_{SL}$ using information contained in the signal net record that corresponds to signal trace $S_L$. For example, the proximity verifier 202 may identify (x,y) coordinates of segment 304a using information contained in the start 610b and end 610c fields of list element 608a. The proximity verifier 202 may, for example, identify segment $T_{ST}$'s starting coordinates, ending coordinates, or midpoint as $T_{ST}$'s (x,y) coordinates in step 434. If coordinates $(x_s, y_s)$ are segment $T_{ST}$'s starting coordinates and coordinates $(x_e, y_e)$ are segment $T_{SL}$'s ending coordinates, the midpoint of segment TSL may be computed as $((x_s+x_e)/2, (y_s+y_e)/2)$. Signal net records 602a–n may contain additional information about signal traces in the package model 201. For example, signal net records 602a–n may contain information about the widths of signal net trace segments in addition to their lengths. In such a case, the proximity verifier 202 may, for example, identify the (x,y) coordinates of segment $T_{SL}$ (FIG. 4B, step 434) as coordinates at either an edge or the center of segment $T_{SL}$, based on the segment width information in the corresponding signal net record. Furthermore, the proximity verifier 202 may measure the distance between segment $T_{SL}$'s (x,y) coordinates and the closest ground metal segment (FIG. 4B, step 436) as the distance between the center of segment $T_{SL}$ and the center of the ground segment or as the distance between the edge of segment $T_{SL}$ and the edge of the ground segment. It should therefore be appreciated that whether a signal trace is "sufficiently close" to ground metal may be measured in any of a variety of ways, including but not limited to the ways just described.

The proximity verifier 202 may also identify multiple (x,y) coordinate pairs as segment $T_{SL}$'s (x,y) coordinates in step 434. For example, the proximity verifier 202 may identify segment $T_{ST}$'s starting coordinates, ending coordinates, and midpoint as segment $T_{ST}$'s (x,y) coordinates in step 434. In such a case, step 436 (determining whether ground metal is above and sufficiently close to segment $T_{SL}$'s (x,y) coordinates) may be performed for each of the identified (x,y) coordinates. The proximity verifier 202 may be configured to select coordinates of as many points on segment $T_{SL}$ as are desired to ensure sufficient proximity of segment $T_{SL}$ to ground metal.

As described above with respect to FIG. 4B, the proximity verifier 202 may determine whether there is ground metal in layer L-1 within a circle centered at coordinates (x,y) and having a radius equal to the proximity threshold PT 508 (step 436). The proximity verifier 202 may make this determination in any of a variety of ways. For example, the package model information 206 may include information descriptive of the locations of ground metal in the layers 104a–c of the package model 201. Such information may take a form similar to the signal net list 600 illustrated in FIG. 6. In addition to describing line segments representing ground lines in the ground layers 104a and 104c, such information may also describe the location of elements (such as gap 306) having other shapes.

In one embodiment, the proximity verifier 202 performs step 436 using a brute force method, in which the proximity verifier 202 identifies (from the package model information 206) the coordinates of all ground metal in the layer above signal trace segment $T_{SL}$, and determines whether the signal trace (x,y) coordinates identified in step 434 are within distance PT of any of the identified ground metal coordinates. The proximity verifier 202 may make such a determination using techniques for determining the minimum distance between particular signal trace (x,y) coordinates and a point, line, circle, or other shape that defines the location of ground metal, such techniques being well-known to those of ordinary skill in the art.

Among the advantages of the invention are one or more of the following.

One advantage of various embodiments of the present invention is that they automate verification of the proximity of ground metal to signal traces in an integrated circuit design, design, a process which conventionally is performed manually. Automated proximity verification enables such verification to be performed more quickly and reliably than manual verification.

Furthermore, the proximity indicators 208 provided by the proximity verifier 202 may be visual indicators included in the graphical representation 106 of the package model 201. Such visual indicators may point out the precise location of problematic signal traces to the package designer 116, thereby making it easier for the package designer 116 to locate and re-route such signal traces. In particular, in embodiments in which the function performed by the proximity verifier 202 is implemented in a real-time design rule, visual indications of problematic signal traces may be provided to the package designer 116 as the package designer 116 is routing signal traces, thereby potentially preventing problematic signal trace placements from occurring. A system which employs real-time proximity verification may enable package design to occur more rapidly and accurately than a system in which proximity verification is only performed after the package design is created.

A further advantage of various embodiments of the present invention is that they provide cross-layer design rule checking. Although existing package design tools include built-in design rules, such rules typically define constraints, such as minimum inter-signal distance, that must be satisfied within a single package layer. Such design rules do not, however, address constraints, such as proximity of signal traces to ground metal, that span multiple package layers. Similarly, automated crosstalk analysis tools typically analyze crosstalk within a single package layer. Various embodiments of the present invention provide means for verifying that cross-layer constraints, such as proximity of signal traces to ground metal, are satisfied, thereby relieving the package designer 116 of the responsibility for performing such verification manually.

A further advantage of various embodiments of the present invention is that they facilitate the transmission of signals along signal lines having a constant characteristic impedance. Gaps in ground metal above and/or below a signal trace cause changes in impedance along the signal trace. Such changes in impedance cause degradation of the transmitted signal. As the rise time of the signal driver decreases, smaller discontinuities will have a larger impact on signal integrity. The aggregate impact of such discontinuities can be to degrade the integrity of the signal so much that may not be reliably received at the receiver. It is therefore desirable to decrease the number and size of such discontinuities, particularly in high-frequency environments. By enabling the package designer 116 to identify and eliminate such discontinuities, various embodiments of the present invention facilitate the process of designing circuits with high signal integrity.

It is to be understood that although the invention has been described above in terms of particular embodiments, the foregoing embodiments are provided as illustrative only, and do not limit or define the scope of the invention. Various other embodiments, including but not limited to the following, are also within the scope of the claims.

Although the techniques described above are described with respect to ground planes, it should be appreciated that similar techniques may be applied in integrated circuits employing signal-reference power supplies to verify that signal traces are sufficiently close to power.

Although the drawings illustrate various data structures (e.g., the configuration information in FIG. 5 and the signal net list 600 in FIG. 6) as having particular logical structures, these are provided merely for purposes of example and do not constitute limitations of the present invention. Rather, alternative data structures for representing equivalent information and for performing equivalent functions will be apparent to those of ordinary skill in the art. Furthermore, although various data structures are described as being implementable as text files, this is not a limitation of the present invention. Rather, such data structures may be implemented as binary files, database files, or using any appropriate computer-readable format.

Furthermore, although the proximity verifier 202 and the configuration information 210 are illustrated in FIG. 2 as distinct entities, it should be appreciated that they may be combined or further subdivided. For example, the proximity verifier 202 may be hard-coded with information contained in the configuration information 210.

Elements and components described herein may be further divided into additional components or joined together to form fewer components for performing the same functions.

The techniques described above may be implemented, for example, in hardware, software, firmware, or any combination thereof. The proximity verifier 202 may, for example, be implemented as a computer program. The techniques described above may be implemented in one or more computer programs executing on a programmable computer including a processor, a storage medium readable by the processor (including, for example, volatile and non-volatile memory and/or storage elements), at least one input device, and at least one output device. Program code may be applied to input entered using the input device to perform the functions described and to generate output. The output may be provided to one or more output devices.

Each computer program within the scope of the claims below may be implemented in any programming language, such as assembly language, machine language, a high-level procedural programming language, or an object-oriented programming language. The programming language may, for example, be a compiled or interpreted programming language.

Each such computer program may be implemented in a computer program product tangibly embodied in a machine-readable storage device for execution by a computer processor. Method steps of the invention may be performed by a computer processor executing a program tangibly embodied on a computer-readable medium to perform functions of the invention by operating on input and generating output. Suitable processors include, by way of example, both general and special purpose microprocessors. Generally, the processor receives instructions and data from a read-only memory and/or a random access memory. Storage devices suitable for tangibly embodying computer program instructions include, for example, all forms of non-volatile memory, such as semiconductor memory devices, including EPROM, EEPROM, and flash memory devices; magnetic disks such as internal hard disks and removable disks; magneto-optical disks; and CD-ROMs. Any of the foregoing may be supplemented by, or incorporated in, specially-designed ASICs (application-specific integrated circuits). A computer can generally also receive programs and data from a storage medium such as an internal disk (not shown) or a removable disk. These elements will also be found in a conventional desktop or workstation computer as well as other computers suitable for executing computer programs implementing the methods described herein, which may be used in conjunction with any digital print engine or marking engine, display monitor, or other raster output device capable of producing color or gray scale pixels on paper, film, display screen, or other output medium.

What is claimed is:

1. A computer-implemented method comprising steps of:
   (A) identifying a segment of a signal trace in a first layer of an integrated circuit design; and
   (B) determining whether there is a signal return path, in a second layer of the integrated circuit design, within a predetermined threshold distance from the signal trace segment by performing steps of:
      (1) identifying coordinates of a first signal return path in the second layer of the integrated circuit design; and
      (2) determining whether the segment coordinates differ from the first signal return path coordinates by more than the predetermined threshold distance.

2. The method of claim 1, wherein the step (B) (1) comprises a step of identifying a plurality of coordinates of the first signal return path in the second layer of the integrated circuit design, and wherein the step (B) (2) comprises steps of:
   (B) (2) (a) determining whether the segment coordinates differ from any of the plurality of signal return path coordinates by more than the predetermined threshold distance;
   (B) (2) (b) determining that there is no signal return path within the predetermined threshold distance of the signal trace segment if it is determined in step (B) (2) (a) that the segment coordinates differ from any of the signal return path coordinates by more than the predetermined threshold distance; and
   (B) (2) (c) determining that there is a signal return path within the predetermined threshold distance of the signal trace segment if it is determined in step (B) (2) (a) that the segment coordinates differ from none of the signal return path coordinates by more than the predetermined threshold distance.

3. The method of claim 2, wherein the first signal return path comprises all signal return paths in the second layer.

4. The method of claim 1, wherein the segment coordinates comprise two-dimensional coordinates within the first layer of the integrated circuit design, wherein the first signal return path coordinates comprise two-dimensional coordinates within the second layer of the integrated circuit design, and wherein the step (B) (2) comprises steps of:
   (B) (2) (a) identifying the length of a line having as endpoints the segment coordinates and the first signal return path coordinates;
   (B) (2) (b) determining that the segment coordinates differ from the first signal return path coordinates by more than the predetermined threshold distance if the length of the identified line is greater than the predetermined threshold distance; and
   (B) (2) (c) determining that the segment coordinates do not differ from the first signal return path coordinates by more than the predetermined threshold distance if the length of the identified line is not greater than the predetermined threshold distance.

5. The method of claim 1, wherein the segment coordinates comprise coordinates of the midpoint of the segment.

6. The method of claim 1, wherein the segment coordinates comprise coordinates of the endpoints of the segment.

7. The method of claim 1, wherein the signal trace segment comprises one of a plurality of segments of the signal trace, and wherein the method further comprises a step of:
   (C) performing the steps (A) and (B) for each of the plurality of segments.

8. The method of claim 7, wherein the signal trace comprises one of a plurality of signal traces in the first layer of the integrated circuit design, and wherein the method further comprises a step of:
   (D) performing the step (C) for each of the plurality of signal traces.

9. The method of claim 1, wherein the integrated circuit design comprises a computer-implemented model of an integrated circuit tangibly stored in a computer-readable medium.

10. The method of claim 1, wherein the first and second layers comprise adjacent layers in the integrated circuit design.

11. The method of claim 1, further comprising a step of:
   (C) providing an error indication if it is determined in the step (B) that there is no signal return path in the second layer within the predetermined threshold distance from the signal trace segment.

12. The method of claim 11, wherein the indication comprises a visual indication in a graphical representation of the integrated circuit design.

13. The method of claim 1, further comprising steps of:
   (C) determining whether there is a signal return path, in a third layer of the integrated circuit design, within the predetermined threshold distance from the signal trace segment.

14. The method of claim 13, wherein the first layer is disposed between the second layer and the third layer in the integrated circuit design.

15. The method of claim 13, further comprising a step of:
   (D) providing an error indication if it is determined in the steps (B) and (C) that that there is no signal return path in either the second or third layer within the predetermined threshold distance from the signal trace segment.

16. The method of claim 1, wherein the signal return path comprises ground metal.

17. The method of claim 1, wherein the signal return path comprises power.

18. A system comprising:
   a computer-readable medium tangibly embodying an integrated circuit design comprising a first layer and a second layer; and
   segment identification means for identifying a segment of a signal trace in the first layer of an integrated circuit design, the segment identification means comprising means for identifying coordinates of the signal trace segment; and
   first proximity verification means for determining whether there is a signal return path, in the second layer of the integrated circuit design, within a predetermined threshold distance from the signal trace segment, the first proximity verification means comprising:
      first signal return path coordinate identification means for identifying coordinates of a first signal return path in the second layer of the integrated circuit design; and
      first coordinate comparison means for determining whether the segment coordinates differ from the first signal return path coordinates by more than the predetermined threshold distance.

19. The system of claim 18, wherein the first signal return path coordinate identification means comprises means for identifying a plurality of coordinates of the first signal return path in the second layer of the integrated circuit design, and wherein the first coordinate comparison means comprises:

means for determining whether the segment coordinates differ from any of the plurality of signal return path coordinates by more than the predetermined threshold distance;

means for determining that there is no signal return path within the predetermined threshold distance of the signal trace segment if it is determined that the segment coordinates differ from any of the signal return path coordinates by more than the predetermined threshold distance; and means for determining that there is a signal return path within the predetermined threshold distance of the signal trace segment if it is determined that the segment coordinates differ from none of the signal return path coordinates by more than the predetermined threshold distance.

20. The system of claim 19, wherein the first signal return path comprises all signal return paths in the second layer.

21. The system of claim 18, wherein the segment coordinates comprise two-dimensional coordinates within the first layer of the integrated circuit design, wherein the first signal return path coordinates comprise two-dimensional coordinates within the second layer of the integrated circuit design, and wherein the first coordinate comparison means comprises:

means for identifying the length of a line having as endpoints the segment coordinates and the first signal return path coordinates;

means for determining that the segment coordinates differ from the first signal return path coordinates by more than the predetermined threshold distance if the length of the identified line is greater than the predetermined threshold distance; and means for determining that the segment coordinates do not differ from the first signal return path coordinates by more than the predetermined threshold distance if the length of the identified line is not greater than the predetermined threshold distance.

22. The system of claim 18, wherein the segment coordinates comprise coordinates of the midpoint of the segment.

23. The system of claim 18, wherein the segment coordinates comprise coordinates of the endpoints of the segment.

24. The system of claim 18, wherein the signal trace segment comprises one of a plurality of segments of the signal trace, and wherein the system further comprises:

segment iteration means for applying the segment identification means and the first proximity verification means to each of the plurality of segments.

25. The system of claim 24, wherein the signal trace comprises one of a plurality of signal traces in the first layer of the integrated circuit design, and wherein the system further comprises:

means for applying the segment iteration means to each of the plurality of signal traces.

26. The system of claim 18, wherein the integrated circuit design comprises a computer-implemented model of an integrated circuit tangibly stored in a computer-readable medium.

27. The system of claim 18, wherein the first and second layers comprise adjacent layers in the integrated circuit design.

28. The system of claim 18, further comprising:

means for providing an error indication if it is determined that there is no signal return path in the second layer within the predetermined threshold distance from the signal trace segment.

29. The system of claim 28, wherein the indication comprises a visual indication in a graphical representation of the integrated circuit design.

30. The system of claim 18, further comprising:

means for determining whether there is a signal return path, in a third layer of the integrated circuit design, within the predetermined threshold distance from the signal trace segment.

31. The system of claim 30, wherein the first layer is disposed between the second layer and the third layer in the integrated circuit design.

32. The system of claim 30, further comprising:

means for providing an error indication if it is determined that that there is no signal return path in either the second or third layer within the predetermined threshold distance from the signal trace segment.

33. The system of claim 18, wherein the segment identification means and the first proximity verification means comprise a computer program written in the Skill scripting language.

34. The system of claim 18, wherein the segment identification means and the first proximity verification means comprise a design rule tangibly embodied in the computer-readable medium, wherein the design rule is defined according to a specification associated with an electronic design automation tool.

35. The system of claim 34, wherein the integrated circuit design includes the design rule.

36. The system of claim 18, wherein the signal return path comprises ground metal.

37. The system of claim 18, wherein the signal return path comprises power.

* * * * *